United States Patent
Hsiao et al.

(10) Patent No.: US 9,454,684 B2
(45) Date of Patent: Sep. 27, 2016

(54) EDGE CRACK DETECTION SYSTEM

(71) Applicant: Taiwan Semiconductor Manufacturing Company Limited, Hsinchu (TW)

(72) Inventors: Huang-Ting Hsiao, Taoyuan County (TW); An-Tai Xu, Cupertino, CA (US); Pei-Haw Tsao, Tai-chung (TW); Cheng-Hung Tsai, Tainan (TW); Tsui-Mei Chen, Hsinchu (TW); Nai-Cheng Lu, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/288,462

(22) Filed: May 28, 2014

(65) Prior Publication Data

US 2015/0347793 A1    Dec. 3, 2015

(51) Int. Cl.
*G06K 7/10* (2006.01)
*H01L 21/304* (2006.01)
*G06K 19/077* (2006.01)

(52) U.S. Cl.
CPC ....... *G06K 7/10366* (2013.01); *G06K 7/10316* (2013.01); *G06K 7/10336* (2013.01); *H01L 21/304* (2013.01); *G06K 19/07749* (2013.01)

(58) Field of Classification Search
CPC .................. G06K 19/0723; G06K 19/07749; G06K 7/0008; G06K 7/10316–7/10366; H01L 2924/00; H01L 2924/0002
See application file for complete search history.

(56) References Cited

U.S. PATENT DOCUMENTS

| | | | | |
|---|---|---|---|---|
| 6,094,138 A | * | 7/2000 | Eberhardt | G06K 7/0008 29/25.01 |
| 8,841,987 B1 | * | 9/2014 | Stanfield | G07C 9/00896 340/5.61 |
| 2003/0189488 A1 | * | 10/2003 | Forcier | A01K 15/023 340/572.1 |
| 2004/0090868 A1 | * | 5/2004 | Endo | G04G 21/04 368/10 |
| 2004/0212504 A1 | * | 10/2004 | Forcier | A01K 15/023 340/572.1 |
| 2005/0225433 A1 | * | 10/2005 | Diorio | G06K 19/0726 340/10.4 |
| 2006/0181421 A1 | * | 8/2006 | Forcier | A01K 15/023 340/572.1 |
| 2006/0226982 A1 | * | 10/2006 | Forster | G06K 7/0008 340/572.1 |
| 2006/0273882 A1 | * | 12/2006 | Posamentier | G06K 19/0723 340/10.4 |
| 2007/0095160 A1 | * | 5/2007 | Georgeson | G01N 29/0645 73/866 |

(Continued)

FOREIGN PATENT DOCUMENTS

TW    200935533 A    8/2009

OTHER PUBLICATIONS

Korean Office Action; Application No. 10-2015-0070257; dated Mar. 28, 2016.

*Primary Examiner* — Hai Phan
*Assistant Examiner* — Orlando Bousono
(74) *Attorney, Agent, or Firm* — Jones Day

(57) ABSTRACT

According to an exemplary embodiment, a method of detecting edge cracks in a die under test is provided. The method includes the following operations: receiving a command signal; providing power from the command signal; providing a response signal based on the command signal; and self-destructing based on the command signal.

16 Claims, 6 Drawing Sheets

(56) References Cited

U.S. PATENT DOCUMENTS

| | | | |
|---|---|---|---|
| 2007/0244657 A1* | 10/2007 | Drago | H04B 17/0085 702/81 |
| 2007/0282541 A1* | 12/2007 | Griess | H04Q 9/00 702/34 |
| 2007/0296582 A1* | 12/2007 | Rofougaran | G06K 19/07758 340/572.1 |
| 2007/0296583 A1* | 12/2007 | Rofougaran | G06K 19/0723 340/572.1 |
| 2008/0012689 A1* | 1/2008 | Liu | G06K 19/0701 340/10.1 |
| 2008/0079588 A1* | 4/2008 | Hughes | G09B 19/0023 340/572.8 |
| 2008/0106378 A1* | 5/2008 | Shanks | H04B 5/0062 340/10.1 |
| 2008/0238680 A1* | 10/2008 | Posamentier | G06K 7/0008 340/572.3 |
| 2008/0252459 A1* | 10/2008 | Butler | G06K 7/0008 340/572.1 |
| 2008/0296373 A1* | 12/2008 | Zmood | A61B 19/44 235/385 |
| 2009/0058604 A1* | 3/2009 | Jung | G06K 19/0723 340/10.1 |
| 2009/0085589 A1* | 4/2009 | Hsieh | G01R 31/2822 324/762.01 |
| 2009/0231107 A1* | 9/2009 | Sato | H04B 5/0062 340/10.3 |
| 2009/0303008 A1* | 12/2009 | Kang | G06K 19/07749 340/10.1 |
| 2010/0225483 A1* | 9/2010 | Scheucher | G06K 7/0095 340/572.3 |
| 2010/0327877 A1* | 12/2010 | Kang | G06K 7/0008 324/537 |
| 2011/0031590 A1* | 2/2011 | Vakanas | B23K 26/36 257/618 |
| 2011/0133901 A1* | 6/2011 | Strzelczyk | G06K 7/0008 340/10.2 |
| 2011/0148570 A1* | 6/2011 | Weidinger | G06K 7/0008 340/5.8 |
| 2011/0273271 A1* | 11/2011 | Alicot | G06K 7/0008 340/10.1 |
| 2012/0161939 A1* | 6/2012 | Posamentier | G06K 7/0008 340/10.1 |
| 2013/0176111 A1* | 7/2013 | Ki | G06K 7/0008 340/10.1 |
| 2013/0217295 A1* | 8/2013 | Karunaratne | A63H 33/042 446/124 |
| 2013/0264390 A1* | 10/2013 | Frey | H01Q 1/2225 235/492 |
| 2013/0339221 A1* | 12/2013 | Gentelet | G06K 7/0008 705/39 |
| 2014/0252077 A1* | 9/2014 | Corby | G06K 5/00 235/375 |
| 2014/0316561 A1* | 10/2014 | Tkachenko | G07F 11/002 700/236 |

* cited by examiner

EDGE CRACK DETECTION SYSTEM

BACKGROUND

During die sawing process, dies often suffer from edge cracks. A traditional method for edge crack detection is visual inspection which cannot be realized after wafer-level packing process, such as tape and reel (TnR). Therefore, there is a need to develop new method for edge crack detection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
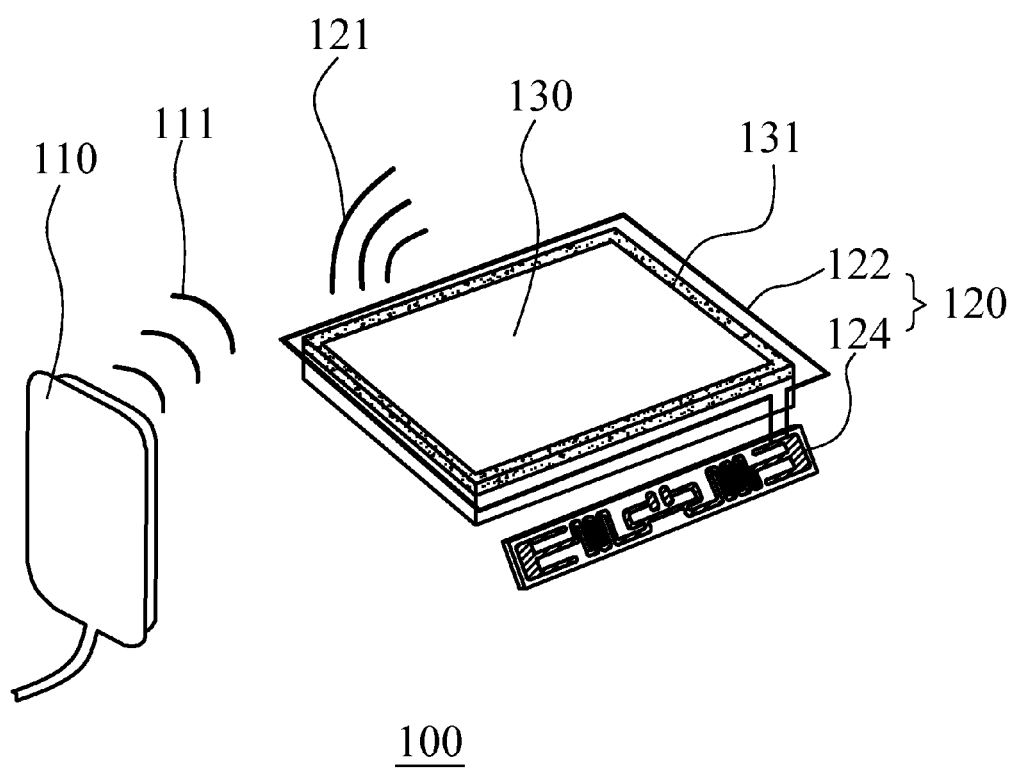
FIG. 1 is a block diagram illustrating an exemplar edge crack detection system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method which uses a RFID reader and a RFID tag to detect edge crack in a die under test. The RFID tag includes a tag antenna and a tag processor. The tag processor is disposed under a seal ring of the die. The tag antenna is disposed outside the seal ring of the die. The RFID reader sends a command signal to the RFID tag. When the die under test has no edge cracks, the tag antenna and the tag processor encircling the die under test are workable to send a response signal to the RFID reader. That is, when receiving the response signal, the RFID reader determines that the die under test has no edge cracks. Additionally, after determining the die has no edge cracks, the RFID reader sends a self-destruction command to destroy or disable the RFID tag, so the method does no impact normal operation of the die. When the edge cracks damaging the die under test, the tag antenna or the tag processor occur, the RFID reader cannot get any response signal.

In details, the method may include the following operations: the tag antenna converts between electromagnet wave and electric signal; the tag processor provides a response signal through the tag antenna; the RFID reader receives the response signal; if the tag antenna does not work, the RFID reader does not receive any signal from the RFID tag; if the RFID reader receives the response signal from the RFID tag, the RFID reader sends a self-destruction command to make the RFID tag self-destruct.

The edge crack detection system may be applied to any RF bands, for example: low frequency (LF) at 120-135 kHz; high frequency (HF) at 13.56 MHz; ultra high frequency (UHF) at 433 MHz or 860-960 MHz; microwave at 2450 MHz.

FIG. 1 is a block diagram illustrating an exemplar edge crack detection system in accordance with some embodiments. As shown in FIG. 1, a system 100 is provided. The system 100 includes a RFID reader 110 and a RFID tag 120 wireless connected to the RFID reader 110. The RFID tag 120 is physically connected to a die under test 130.

The RFID tag 120 may include an antenna 122 outside the seal ring 131 of the die 130. The antenna 122 may have a width of 1 micrometer. The RFID tag 120 may include a processor 124 disposed under a seal ring 131 of the die 130. The processor 124 may have a width of 10 micrometer and a length of 500 micrometer.

The RFID reader 110 provides a command signal 111. The RFID tag 120 receives the command signal 111. The RFID tag 120 produces power from the command signal 111 and provides a response signal 121 based on the command signal 111. The RFID reader 110 receives the response signal 121 so that the RFID reader 110 determines the workability of the RFID tag 120 as well as the die under test 130.

The RFID reader 110 provides the command signal 111 regarding the RFID tag's self-destruction based on the response signal 121. The RFID tag 120 receives the command signal 111 and self-destructs based on the command signal 111. The RFID tag may further compare the command signal 111 with a lookup table (not shown) to determine whether to provide the response signal 121 or to self-destruct. For example, the command signal 111 and the lookup table (not shown) may both include two digits. The two digits representing the RFID tag's self-destruction may refer to "00", and the two digits of the command signal 111 representing the RFID tag's response or workability may refer to "11".

Moreover, the RFID reader 110 determines that the die under test 130 has no edge cracks when receiving the response signal 121 indicating the workability of the RFID tag 120. After the self-destruction of the RFID tag 120, the RFID tag 120 no longer provides the response signal 121 and has no impact to the die under test 130. Additionally, the RFID reader 110 provides the command signal 111 in the form of electromagnet wave, and the RFID tag 120 provides the response signal 121 in the form of electromagnet wave as well.

Figure 2:
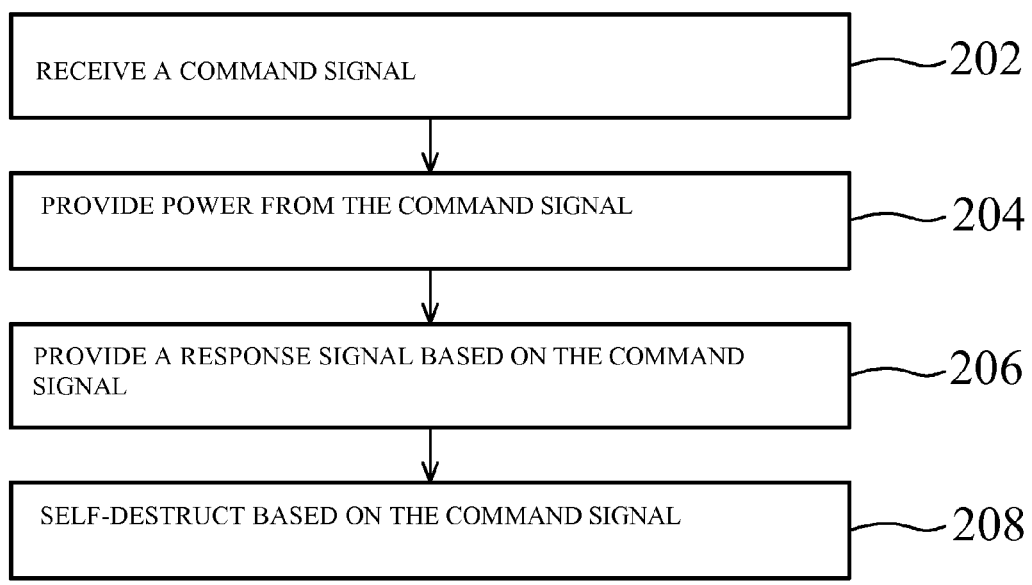
FIG. 2 is a flow chart for a method of detecting edge cracks in a die under test in accordance with some embodiments.

FIG. 2 is a flow chart for a method of detecting edge cracks in a die under test in accordance with some embodiments. As shown in FIGS. 1 and 2, a method 200 is provided. The method 200 includes the following operations: receiving a command signal 111 (202); providing power from the command signal 111 (204); providing a response signal 121 based on the command signal 111 (206); and self-destructing based on the command signal 111 (208). The method 200 further includes comparing the command signal 111 with a lookup table (not shown) to determine whether to provide the response signal 121 or to self-destruct.

Figure 3:
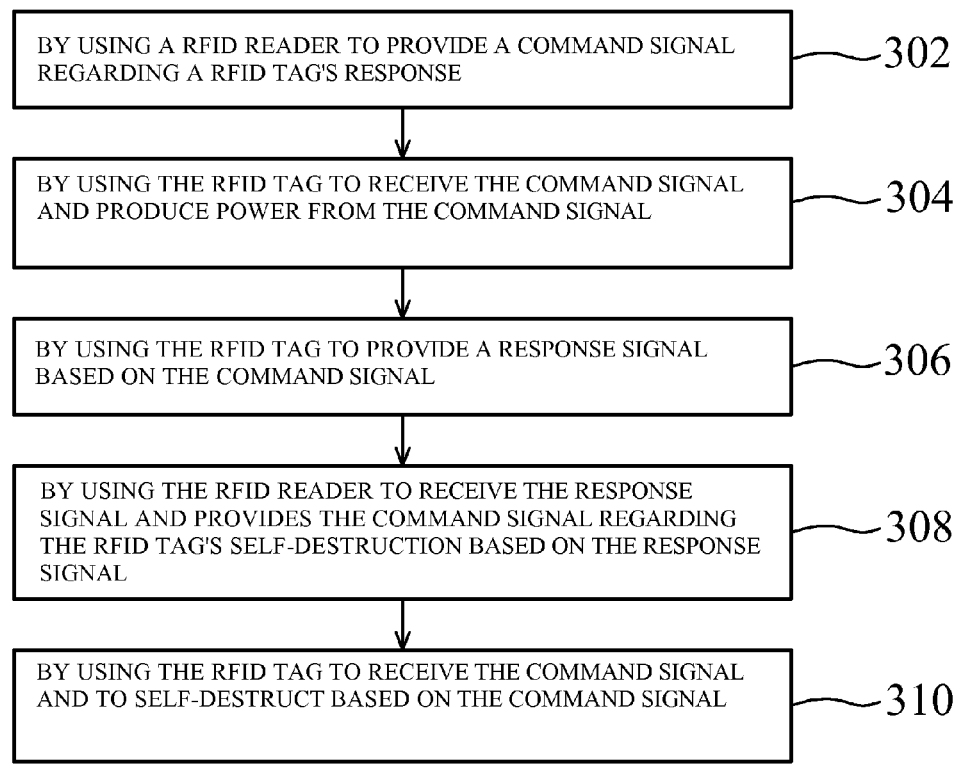
FIG. 3 is a flow chart for a method of detecting edge cracks in a die under test in accordance with some embodiments.

FIG. 3 is a flow chart for a method of detecting edge cracks in a die under test in accordance with some embodiments. As shown in FIGS. 1 and 3, a method 300 is provided. The method 300 includes the following operations: by using a RFID reader 110 to provide a command signal 111 regarding a RFID tag's response (302); by using the RFID tag 120 to receive the command signal 111 and produce power from the command signal 111 (304); by using the RFID tag 120 to provide a response signal 121 based on the command signal 111 (306); by using the RFID reader 110 to receive the response signal 121 and provides the command signal 111 regarding the RFID tag's self-destruction based on the response signal 121 (308); and by using the RFID tag 120 to receive the command signal 111 and to self-destruct based on the command signal 111 (310).

Furthermore, the method 300 may further include disposing a processor 124 of the RFID tag 120 under a seal ring 131 of the die 130. The method 300 may further include disposing an antenna 122 of the RFID tag 120 outside a seal ring 131 of the die 130. The method 300 may further include determining that the die 130 has no edge cracks when receiving the response signal 121. The method 300 may further include no longer providing the response signal 121 after the self-destruction of the RFID tag 120. The method 300 may further include having no impact to the die 130 after the self-destruction of the RFID tag 120. The method 300 may further include by using the RFID tag 120 to compare the command signal 111 with a lookup table to determine whether to provide the response signal 121 or to self-destruct. The operation 302 may further include providing the command signal 111 in the form of electromagnet wave. The operation 302 may further include providing the response signal 121 in the form of electromagnet wave.

Figure 4:
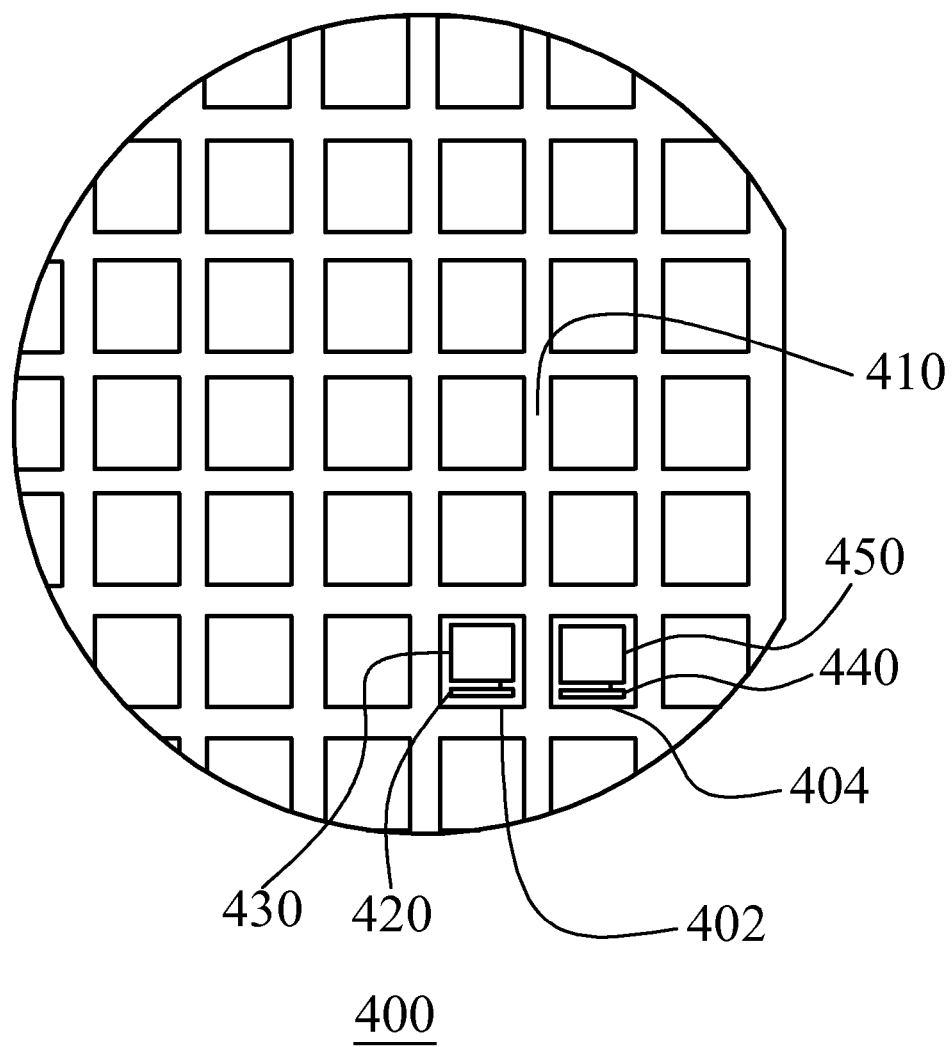
FIG. 4 is a block diagram illustrating a wafer including chips having the exemplar RFID tag in accordance with some embodiments.

Next, more details of the exemplar edge crack detection system will be depicted. FIG. 4 is a block diagram illustrating a wafer including chips having the exemplar RFID tag in accordance with some embodiments. As shown in FIG. 4, a wafer 400 is provided. The wafer 400 has a plurality of chips separated by a plurality of scribe lines. For example, the first chip 402 and the second chip 404 are separated by the scribe line 410.

The first chip 402 includes a RFID tag 420 and a die under test 430. The RFID tag 420 is physically connected to a die under test 430. The RFID tag 420 is not limited to the shape in FIG. 4, and may include an antenna (not shown) encircling the die under test 430. The antenna may have a width of 1 micrometer. The RFID tag 420 may further include a processor disposed under a seal ring of the die under test 430. The processor may have a width of 10 micrometer and a length of 500 micrometer. The second chip 404 includes another RFID tag 440 and another die under test 450. The function of the RFID tag 440 and the die under test 450 is similar to the RFID tag 420 and the die under test 430, and is not repeated herein.

The wafer 400 will be diced at those scribe lines to produce individual chips. For example, the wafer 400 will be cut along the scribe line 410 to produce the first chip 402 and the second chip 404. In the embodiment, the dicing is performed using techniques, for example, physical sawing or laser sawing.

Figure 5:
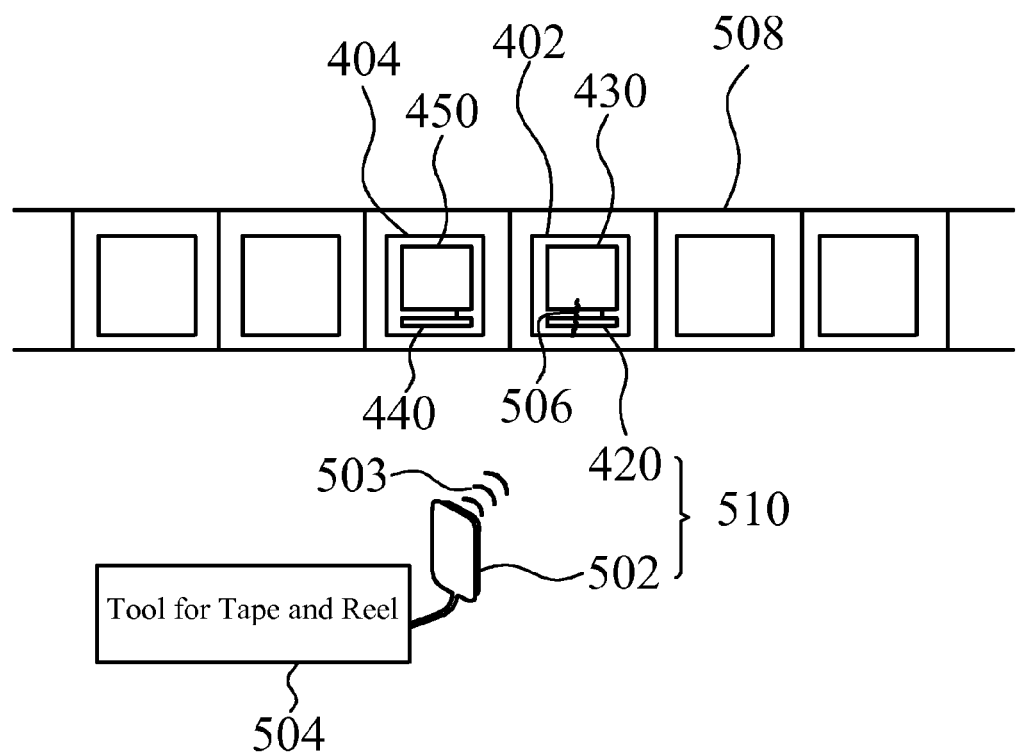
FIG. 5 is a block diagram illustrating the exemplar edge crack detection system using tape and reel packing in accordance with some embodiments.

FIG. 5 is a block diagram illustrating the exemplar edge crack detection system using tape and reel packing in accordance with some embodiments. As shown in FIG. 5, the chips are placed on tape and reel 508 for distribution to the client. However, during tape and reel packing, cracks damaging the chips easily occur. By using the exemplar edge crack detection system 510 including a RFID reader 502 and a RFID tag 420 wirelessly connected to the RFID reader 502, the chips with cracks can be easily detected.

In the embodiment, during tape and reel packing, a crack 506 occurs in the first chip 402, and damages the RFID tag 420 and the die under test 430. When the tool 504 for tape and reel asks the RFID reader 502 to provide a command signal 503, the RFID tag 420 is unable to receive the command signal 503 and transmit any response signal. Then, the tool 504 for tape and reel connected to the RFID reader 502 cannot get any response signal. Therefore, the tool 504 for tape and reel determines failure of the first chip 402.

In the embodiment, no crack occurs in the second chip 404. When the die under test 450 has no edge cracks, the RFID tag 440 connected to the die 450 is workable to send a response signal to the RFID reader 502. That is, when receiving the response signal, the RFID reader 502 determines that the die 450 under test has no edge cracks. Additionally, after determining the die 450 has no edge cracks, the RFID reader 502 sends a self-destruction command to destroy or disable the RFID tag 440, so the method does no impact normal operation of the die 450.

Figure 6:
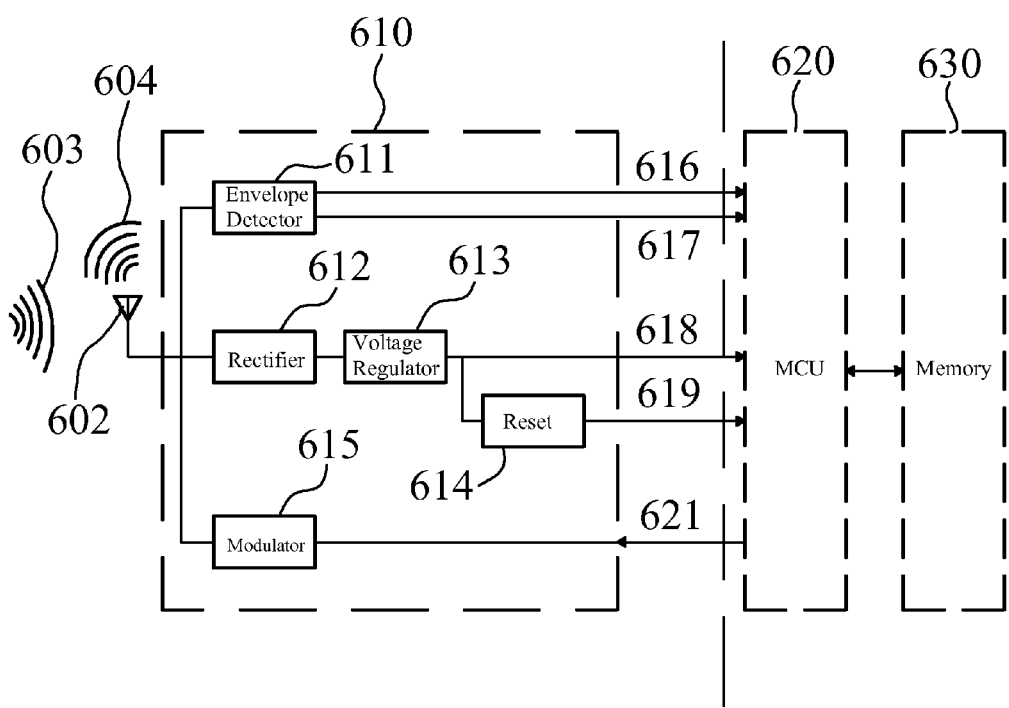
FIG. 6 is a block diagram illustrating another exemplar RFID tag in accordance with some embodiments.

FIG. 6 is a block diagram illustrating an exemplar RFID tag in accordance with some embodiments. The RFID tag 120 may be configured as shown in FIG. 6. The RFID tag 120 includes an antenna 602, an analog front end (AFE) 610, a MCU and a memory 630. The analog front end (AFE) 610 includes an envelope detector 611, a rectifier 612, a voltage regulator 613, a reset unit 614, and a modulator 615. The RFID tag 120 is connected to a die under test.

The antenna 602 receives the command signal 603. The rectifier 612 and the voltage regulator 613 produce power 618 from the command signal 603. The reset unit 614 sends a reset signal 619 to initialize the MCU 620. The envelope detector 611 extracts a demodulated signal 616 and a clock 617 from the command signal 603. The MCU 620 provides a control signal 621 to the modulator 615 based on the demodulated signal 616. Via the antenna 602, the modulator 615 modulates the control signal 621 and sends the response signal 121 to a RFID reader (not shown). The response signal 121 may carry information about workability of the RFID tag 120 as well as the die under test. After the workability is confirmed, the MCU 620 further performs self-destructing based on the demodulated signal 616 and the data in the memory 630.

According to an exemplary embodiment, a method of detecting edge cracks in a die under test is provided. The method includes the following operations: receiving a command signal; providing power from the command signal; providing a response signal based on the command signal; and self-destructing based on the command signal.

According to an exemplary embodiment, a method of detecting edge cracks in a die under test is provided. The method includes the following operations: by using a RFID reader to provide a command signal regarding a RFID tag's response; by using the RFID tag to receive the command signal and produce power from the command signal; by using the RFID tag to provide a response signal based on the command signal; by using the RFID reader to receive the response signal and provides the command signal regarding the RFID tag's self-destruction based on the response signal; and by using the RFID tag to receive the command signal and to self-destruct based on the command signal.

According to an exemplary embodiment, an edge crack detection system for a die under test is provided. The system includes a RFID reader and a RFID tag. The RFID reader provides a command signal. The RFID tag is wireless connected to the RFID reader, receives the command signal, produces power from the command signal, and provides a response signal based on the command signal. The RFID reader receives the response signal and provides the command signal regarding the RFID tag's self-destruction based on the response signal, and the RFID tag receives the command signal and self-destructs based on the command signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of detecting edge cracks in a die under test, comprising:
   providing a command signal regarding a radio frequency identification (RFID) tag's response using an RFID reader;
   completely encircling a die under test using an antenna of the RFID tag disposed outside a seal ring surrounding the entire periphery of the die under test;
   using the RFID tag to receive the command signal and produce power from the command signal;
   providing a response signal using the RFID tag based on the command signal;
   receiving the response signal and providing the command signal regarding the RFID tag's self-destruction based on the response signal using the RFID reader; and
   receiving the command signal and self-destructing based on the command signal using the RFID tag.

2. The method of claim 1, further comprising disposing a processor of the RFID tag under the seal ring of the die.

3. The method of claim 1, further comprising determining that the die under test has no edge cracks when receiving the response signal.

4. The method of claim 1, further comprising no longer providing the response signal after the self-destruction of the RFID tag.

5. The method of claim 1, further comprising having no impact to the die under test after the self-destruction of the RFID tag.

6. The method of claim 1, further comprising comparing the command signal with a lookup table to determine whether to self-destruct.

7. The method of claim 1, wherein providing the command signal by using the RFID reader further comprises providing the command signal in the form of an electromagnetic wave.

8. The method of claim 1, wherein providing the response signal further comprises providing the response signal in the form of an electromagnetic wave.

9. An edge crack detection system, comprising:
   a radio frequency identification (RFID) reader providing a command signal; and
   an RFID tag wirelessly connected to the RFID reader, the RFID tag comprising an antenna completely encircling a die under test, the antenna disposed outside a seal ring surrounding the entire periphery of the die under test, wherein the antenna receives the command signal, produces power from the command signal, and provides a response signal based on the command signal, wherein the RFID reader receives the response signal from the RFID tag and provides the command signal regarding the RFID tag's self-destruction based on the response signal from the RFID tag, and the RFID tag receives the command signal and self-destructs based on the command signal.

10. The system of claim 9, wherein the RFID reader further determines that the die under test has no edge cracks when receiving the response signal.

11. The system of claim 9, wherein after the self-destruction of the RFID tag, the RFID tag no longer provides the response signal.

12. The system of claim 9, wherein after the self-destruction of the RFID tag, the RFID tag has no adverse impact to the die under test.

13. The system of claim 9, wherein the RFID tag compares the command signal with a lookup table to determine whether to provide the response signal or to self-destruct.

14. The system of claim 9, wherein the RFID reader provides the command signal in the form of an electromagnetic wave.

15. The system of claim 9, wherein the RFID tag provides the response signal in the form of an electromagnetic wave.

16. The system of claim 9, wherein the RFID tag further comprises: a processor disposed under the seal ring of the die.

* * * * *